United States Patent
Bachleitner Hofmann et al.

(10) Patent No.: US 10,585,148 B2
(45) Date of Patent: Mar. 10, 2020

(54) MAGNETIC SENSOR DEVICE AND METHOD FOR A MAGNETIC SENSOR DEVICE HAVING A MAGNETO-RESISTIVE STRUCTURE

(71) Applicant: Infineon Technologies AG, Neubiberg (DE)

(72) Inventors: Anton Bachleitner Hofmann, Vienna (AT); Hubert Brueckl, Wiener Neudorf (AT); Klemens Pruegl, Regensburg (DE); Wolfgang Raberg, Sauerlach (DE); Armin Satz, Villach (AT); Dieter Suess, Vienna (AT); Tobias Wurft, München (DE)

(73) Assignee: Infineon Technologies AG, Neubiberg (DE)

( * ) Notice: Subject to any disclaimer, the term of this patent is extended or adjusted under 35 U.S.C. 154(b) by 421 days.

(21) Appl. No.: 15/375,995

(22) Filed: Dec. 12, 2016

(65) Prior Publication Data

US 2017/0227613 A1    Aug. 10, 2017

(30) Foreign Application Priority Data

Feb. 9, 2016    (DE) .......... 10 2016 102 214

(51) Int. Cl.
*G01R 33/00* (2006.01)
*G01R 33/09* (2006.01)
*H01L 43/02* (2006.01)
*H01L 43/08* (2006.01)

(52) U.S. Cl.
CPC ....... *G01R 33/0017* (2013.01); *G01R 33/091* (2013.01); *H01L 43/02* (2013.01); *H01L 43/08* (2013.01)

(58) Field of Classification Search
CPC .... G01R 33/091; G01R 33/0017; H01L 43/02
USPC .......................................... 324/252
See application file for complete search history.

(56) References Cited

U.S. PATENT DOCUMENTS

| | | | |
|---|---|---|---|
| 6,680,831 B2 * | 1/2004 | Hiramoto | H01L 43/08 257/E43.004 |
| 2008/0180865 A1 * | 7/2008 | Min | B82Y 10/00 360/324.11 |
| 2013/0116943 A1 * | 5/2013 | Pant | G01R 33/098 702/57 |
| 2015/0185297 A1 | 7/2015 | Zimmer et al. | |

* cited by examiner

*Primary Examiner* — Reena Aurora
(74) *Attorney, Agent, or Firm* — Harrity & Harrity, LLP

(57) ABSTRACT

An embodiment relates to a magnetic sensor device (500) comprising a magneto-resistive structure (501). The magneto-resistive structure (501) comprises a magnetic free layer (502) configured to spontaneously generate a closed flux magnetization pattern in the free layer (502). The magneto-resistive structure (500) also comprises a magnetic reference layer (506) having a non-closed flux reference magnetization pattern. The magnetic sensor device (500) further comprises a current generator (580) configured to generate an electric current in one or more layers of the magneto-resistive structure (501). The electric current has a non-zero directional component perpendicular to the reference magnetization pattern.

20 Claims, 12 Drawing Sheets

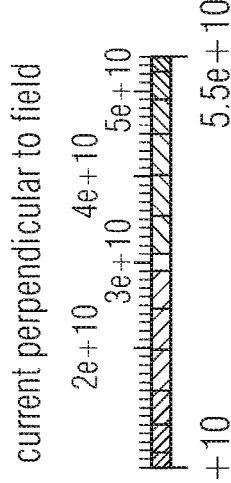
FIG. 6A
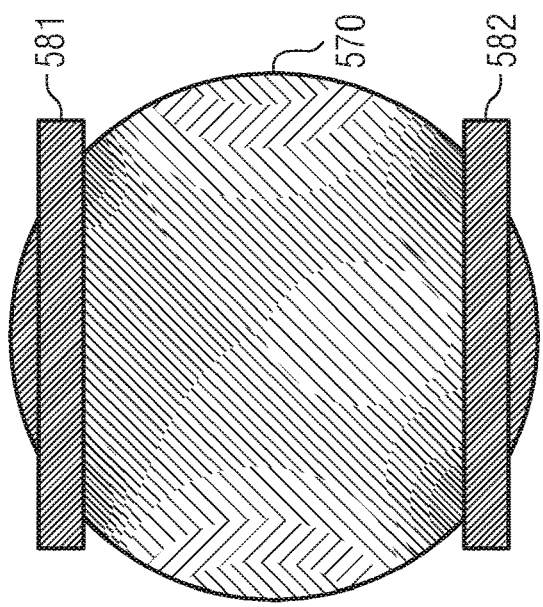
FIG. 6B
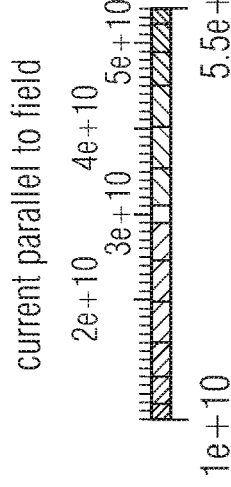
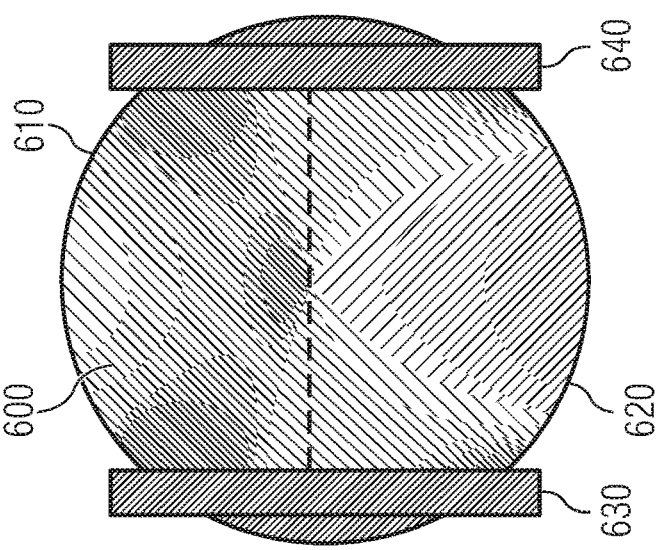
FIG. 6C
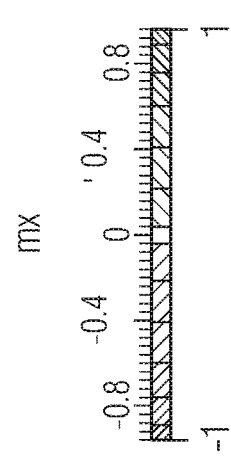
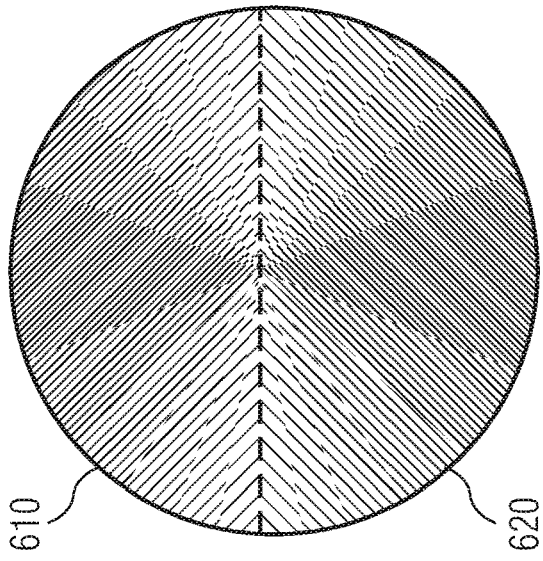

MAGNETIC SENSOR DEVICE AND METHOD FOR A MAGNETIC SENSOR DEVICE HAVING A MAGNETO-RESISTIVE STRUCTURE

RELATED APPLICATION

This application claims priority under 35 U.S.C. § 119 to German Patent Application No. 102016102214.4, filed on Feb. 9, 2016, the content of which is incorporated by reference herein in its entirety.

FIELD

The present disclosure relates to magnetic sensor devices and methods for magnetic sensor devices including magneto-resistive structures.

BACKGROUND

Magneto-resistive effects include a number of different physical phenomena, all of which having in common that an electrical resistance of a resistive element is alterable by the behavior of a magnetic field penetrating the resistive element. Technologies utilizing magneto-resistive effects are sometimes referred to as "xMR technologies", whereby the "x" indicates that a multitude of effects may be addressed here, like the Giant Magneto-Resistive (GMR) effect, the Tunnel Magneto-Resistive (TMR) effect, or the Anisotropic Magneto-Resistive (AMR) effect, to mention just a few examples. xMR effects may be applied in a variety of field-based sensors, for example for measuring revolution, angles, etc. In some applications, especially in applications relevant to safety, it is required that these sensors operate reliably and at a high level of accuracy.

Since hysteresis behavior of the sensor may result in erroneous measurement results, magnetic xMR sensor concepts with a free layer in a vortex configuration may be used. Such sensors may have nearly zero hysteresis. Low hysteresis may in other words be achieved in presence of a vortex magnetization state (magnetic field) in the free layer and may especially be interesting in applications such as wheel speed sensing, current sensing, or linear field sensing. The vortex magnetization state is characterized by having locally different orientation of the magnetization, basically pointing in all possible directions within the hemisphere. The vortex magnetization state, however, may result in formation of regions of the free layer having parallel magnetization, and such having anti-parallel magnetization with respect to a reference magnetization. Therefore, these regions may cause either low or high resistivity, respectively, to an electric current passing through them. This in turn may lead to undesirable asymmetries or non-linearity in resistance behavior as function of an external field strength. The external field and external field strength is usually the quantity to be measured. In other words, for example, changes of external field strength by identical amounts may lead to resistance shifts by different amounts, depending on whether the external field is increased or decreased in strength, or depending on a starting value of field strength. Resistance behavior in dependence of external magnetic field strength (or vortex position) may be described in the so-called resistance transfer function.

It is hence desirable to provide a sensor element exhibiting a more symmetric and more linear resistance behavior.

SUMMARY

According to a first aspect, the present disclosure provides a magnetic sensor device comprising a magneto-resistive structure. The magneto-resistive structure comprises a magnetic free layer configured to spontaneously generate a closed flux magnetization pattern in the free layer. The magneto-resistive structure also comprises a magnetic reference layer having a non-closed flux reference magnetization pattern. The magnetic sensor device further comprises a current generator configured to generate an electric current in one or more layers of the magneto-resistive structure. The electric current has a non-zero directional component perpendicular to the reference magnetization pattern.

A magneto-resistive structure may for example be formed by alternating magnetic and non-magnetic layers. The terms "magnetic" and "non-magnetic" may in this context be understood as "ferromagnetic" and "non-ferromagnetic". A "non-magnetic" layer may thus have paramagnetic, diamagnetic or antiferromagnetic properties. A layer may extend essentially into two directions x and y of a Cartesian coordinate system with three pair-wise perpendicular directions x, y, and z. In other words, an extension of the layer into a third direction z may be relatively small compared to its extension into the first and second directions x and y. If direction x corresponds to a direction of the reference magnetization, the electric current may for instance have a directional x-component equal to zero, and non-zero y- and z-components.

The closed flux magnetization pattern may also be referred to as a vortex state. A spontaneously generated vortex state may for instance form in the free layer directly after its production, or if no external field is applied. The non-closed flux reference magnetization pattern may in other words correspond to a homogeneous, straight, uniaxial, or linear magnetic field having zero curl and zero divergence. Allowing the electric current to flow at least partially perpendicular to the reference magnetization may force the current to pass through zones within the magneto-resistive structure having low resistivity and also through zones having high resistivity. In other words, differences in resistivity of multiple paths the current may possibly follow may thus be notably reduced. Hence, any given path may be less preferable over another in comparison to a conventional sensor with a current running parallel to the reference magnetization, leading to a less asymmetric or more linear resistance transfer function.

In some embodiments, the current generator is configured to generate the electric current having a non-zero directional component in-plane, e.g., essentially parallel to the plane of one or more layers of the magneto-resistive structure. In other words, the current generator is configured to generate the electric current in-plane with a non-zero directional component perpendicular to the reference magnetization pattern. The term in-plane may relate to a layer of the magneto-resistive structure, for example the free layer, extending predominantly in the x-y-plane. Thus, an in-plane component perpendicular to the reference magnetization pattern may in other words correspond to a y-component. This structure is also referred to as a current-in-plane, CIP, sensor structure. Thus, in some embodiments, the magneto-resistive structure may correspond to a Current-In-Plane, CIP, structure.

In some embodiments, the current generator is configured to generate the electric current in the magneto-resistive structure (for example, in the magnetic free layer) perpendicular to the reference magnetization pattern. In other words, also a z-component of the electric current may be zero. The effect of a more even current distribution may hence be increased or even maximized.

In some embodiments, the magnetic free layer is of centrally symmetric shape. This shape may in other words result from rotation by a predetermined angle around a central axis parallel to the z-direction, and for example comprise equiangular, equilateral, or regular polygons (triangle, square, hexagon, etc.), or ellipses. It may thus be possible to facilitate spontaneous vortex formation.

In some embodiments, the current generator comprises at least a first electrode coupled to the magneto-resistive structure or the free layer thereof and a second electrode coupled to the magneto-resistive structure or the free layer to cause an electrical current in the magneto-resistive structure between the first and second electrodes in a direction having a component perpendicular to the reference magnetization pattern. This may force an electric current to follow a path crossing low-resistivity regions and high-resistivity regions. Overall respective resistivity of possible paths for the current may differ less from one another, leading to a more evenly spread current distribution. The latter in turn may lead to a more symmetric resistance transfer function.

In some embodiments, the first electrode and the second electrode are located on opposite sides of the magneto-resistive structure or the free layer. Thus, a width of the magneto-resistive structure or the free layer may be exploited to a higher grade, which in turn may increase sensor range.

In some embodiments, the first electrode and/or the second electrode spans at least 50% of a diameter of the free layer in a direction parallel to the reference magnetization pattern. If the free layer has a non-circular shape, diameter may correspond to e.g. a major or a minor axis of an ellipse, or to a diameter of an inscribed or a circumscribed circle of a polygon. Thus, a width of the free layer in a direction of the reference magnetization pattern may be exploited to a higher grade, which may remove undesirable effects arising from current paths crossing a vortex center.

In some embodiments, a distance between the first electrode and the second electrode is at least 50% of a diameter of the free layer in a direction perpendicular to the reference magnetization pattern. Sensor range may thus be increased, or reductions in sensor range may be lessened.

In some embodiments, the first electrode and/or the second electrode comprise at least a first electrode region and a separate second electrode region. A contact region between the magneto-resistive structure or the free layer and the first electrode region is spatially separated from a contact region between the magneto-resistive structure or the free layer and the second electrode region. This may offer a possibility for the current to avoid direct crossing of a vortex center, which may otherwise lead to perturbation effects. Asymmetries in the resistance transfer function may therefore be reduced even further.

In some embodiments, at least one of the first and the second electrodes has an edge extending parallel to the reference magnetization pattern and face an opposite of the first and the second electrodes. This may enable equal length for possible (direct) current paths, which may result in a more evenly spread current distribution or electric flux.

In some embodiments, at least one of the first and the second electrodes has a rectangular shape with a main extension along the reference magnetization pattern. Production of a free layer with rectangular electrodes may for example be less complicated.

In some embodiments, the magneto-resistive structure corresponds to a giant magneto-resistive, GMR, structure or a tunnel magneto-resistive, TMR, structure. Various implementations may hence be applicable to different sensor types.

According to another aspect, some embodiments relate to a magneto-resistive sensor element. The magneto-resistive sensor element comprises a magnetic free layer configured to spontaneously generate a vortex magnetization pattern in the free layer. The magneto-resistive sensor element also comprises a magnetic reference layer having a linear or straight reference magnetization pattern. The magneto-resistive sensor element further comprises a first electrical contact portion coupled to one or more layers of the magneto-resistive element and spanning at least 50% of a diameter of the free layer in a direction parallel to the reference magnetization pattern. Furthermore, the magneto-resistive sensor element comprises a second electrical contact portion coupled to the one or more layers opposite to the first electrical contact portion and spanning at least 50% of a diameter of the free layer in a direction parallel to the reference magnetization pattern. The first and the second electrical contact portions are configured to generate, in the one or more layers, an electric field between the first and the second electrical contact portions perpendicular to the reference magnetization pattern.

In some embodiments, the magnetic free layer is of rotationally symmetric shape. Preferably, the free layer may have the shape of a circular disk or ellipse, though geometry of the free layer is not limited only to these examples. Spontaneous vortex formation may hence be facilitated.

According to a further aspect, some embodiments relate to a method for a magnetic sensor device having a magneto-resistive structure. The method comprises providing a non-closed flux reference magnetization pattern in a magnetic reference layer of the magneto-resistive structure. The method also comprises spontaneously generating a closed flux magnetization pattern in the magnetic free layer. The method further comprises generating an electric current flow in one or more layers of the magneto-resistive structure. The electric current flow has a non-zero directional component perpendicular to the reference magnetization pattern.

In some embodiments, generating the electrical current comprises generating the current flow with a transversal flow of electric charge in the magneto-resistive structure or the free layer thereof. In other words, generating the electrical current comprises generating the current flow parallel to the plane of one or more layers of the magneto-resistive structure.

BRIEF DESCRIPTION OF FIGURES

Some embodiments of apparatuses and/or methods will be described in the following by way of example only, and with reference to the accompanying figures, in which

FIG. 6A shows a contour plot of a closed-flux magnetization pattern in a free layer according to an example;

FIG. 6B shows current distribution in the free layer of the embodiments of FIGS. 5A-5F if the current is applied parallel to a reference magnetization pattern;

FIG. 6C shows current distribution in the free layer of FIG. 5A or 5B if the current is applied perpendicular to a reference magnetization pattern, according to an embodiment;

DETAILED DESCRIPTION

Figure 1:
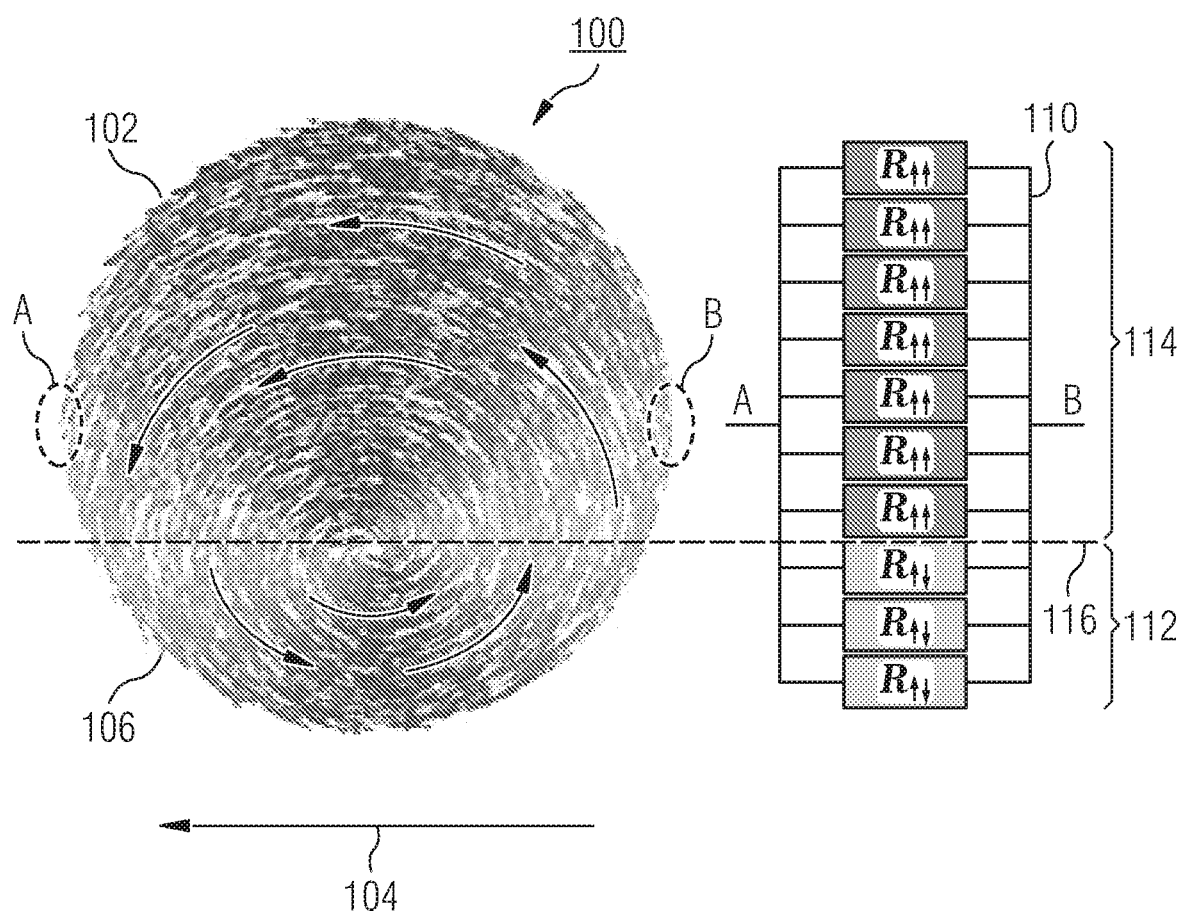
FIG. 1 shows an example of a closed flux magnetization pattern in a free layer and a corresponding equivalent circuit diagram.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

xMR sensor elements, for example giant magneto-resistive (GMR) elements or tunnel magneto-resistive (TMR) elements (which are also known as a spin valve or bottom spin valve, BSV) may have a layer stack of alternating ferromagnetic and non-ferromagnetic layers. From the bottom up, an xMR sensor element may, in an example embodiment, comprise an antiferromagnetic pinning layer, a ferromagnetic pinned layer, a diamagnetic coupling layer, a ferromagnetic reference layer with a reference magnetization having a linear or straight pattern, an electrically insulating tunnel barrier or diamagnetic layer, and a ferromagnetic free layer. The skilled person having benefit from the present disclosure will appreciate that the above composition of layers is merely one of many possibilities to form an xMR sensor element. A reverse composition is possible as well, for example. For example, the free layer may be comprised of a composition of ferromagnetic and non-magnetic layers. A free layer composed of a multilayer structure with layers with a conductivity close to the coupling layer and layers with small conductivity further away from the coupling may be beneficial for the application. The free layer or the pinned layer may by a multilayer structures comprising spin injections layers leading to a high spin polarization.

Resistivity of xMR sensors having a closed flux magnetization pattern in the free layer or, in other words, a vortex state, may be described using a resistance transfer function, which expresses (normalized) resistance as a function of a vortex position. Vortex position itself may depend on strength of an external magnetic field component to be measured, which may be aligned parallel to a reference magnetization of the xMR sensor. xMR sensors that feature a magnetic vortex state, may exhibit a non-linearity in the resistance transfer function, opposed to a quasi linear magnetization transfer function for fields smaller than an annihilation field. The annihilation field describes a threshold in external magnetic field strength at which the vortex state may dissolve.

The cause for non-linearity in the resistance transfer function may be explained with FIG. 1. This non-linearity is due to a non-uniform current distribution which may arise out of the fact that a vortex state in the sensor structure, or a free layer 100 of the sensor, gives rise to a first region 102 where the free layer magnetization points predominantly parallel to a pinned layer magnetization 104, and a second region 106 where the free layer magnetization points predominantly anti-parallel to pinned layer magnetization 104. The two regions 102, 106 may exhibit different electrical resistivity due to the xMR effect; for example resistance may be higher in second region 106 with its predominantly anti-parallel magnetization, and lower in first region 102 with its predominantly parallel magnetization. If an electric current passes through reference layer 100 between two coupling points A and B, or, effectively parallel to pinned layer magnetization 104, this may lead to a higher current density in low-resistivity region 102 than in high-resistivity region 106. This may effectively give more weight to low-resistivity region 102 in terms of electrical resistance as the electric current may avoid passing through high-resistivity region 106. A lower total resistance and a less linear resistance transfer function compared to a uniform current distribution may hence result. In particular, vortex shifts perpendicular to pinned layer magnetization 104 may narrow or widen low-resistivity region 102, but affect resistivity itself in an electric current path across low-resistivity region 102 only slightly.

According to some conventional solutions, the current-in-plane, CIP, sensor structure may be contacted causing current flow parallel or anti-parallel to pinned layer magnetization 104. Electrical contacts may however overlap free layer 100 and practically reduce its width available for vortex core movement. If the electrical contacts are aligned with pinned layer magnetization 104, this may on the one hand result in higher sensor range, because the vortex core may move in a direction perpendicular to current flow and may thus avoid 'collisions' with the electrical contacts. On the other hand, however, it may give inferior sensor linearity due to a strongly asymmetrical current distribution.

This asymmetrical current distribution may be understood in terms of a simple equivalent circuit diagram where the resistance of a vortex structure is approximated by a parallel circuit 110 of a large number of resistors. The parallel circuit comprises a set of high value resistors 112 and a set of low value resistors 114. A dividing point 116 between the two sets corresponds to the vortex core position and is controlled by a parameter $\lambda \in [-1,1]$. For a large number $N \to \infty$ of resistors, the total resistance becomes $$R(\lambda) = \frac{1}{\frac{1}{Z}\left(\frac{A(\lambda)}{R_{\uparrow\downarrow}} + \frac{B(\lambda)}{R_{\uparrow\uparrow}}\right)},$$

and normalizing the resistance function to make the results independent of particular choices of materials yields $$r(\lambda) = \frac{R(\lambda) - R(-1)}{R(+1) - R(-1)} = \frac{R(\lambda) - R_{\uparrow\uparrow}}{R_{\uparrow\downarrow} - R_{\uparrow\uparrow}} = \frac{1}{XMR}\left[\frac{Z(XMR+1)}{A(\lambda) + B(\lambda)(XMR+1)} - 1\right].$$

Therein, Z=A+B=1 is the normalization factor and $$XMR = \frac{R_{\uparrow\downarrow} - R_{\uparrow\uparrow}}{R_{\uparrow\uparrow}} \quad A(\lambda) = \frac{\lambda+1}{2} \quad B(\lambda) = 1 - \frac{\lambda+1}{2}.$$

Figure 2:
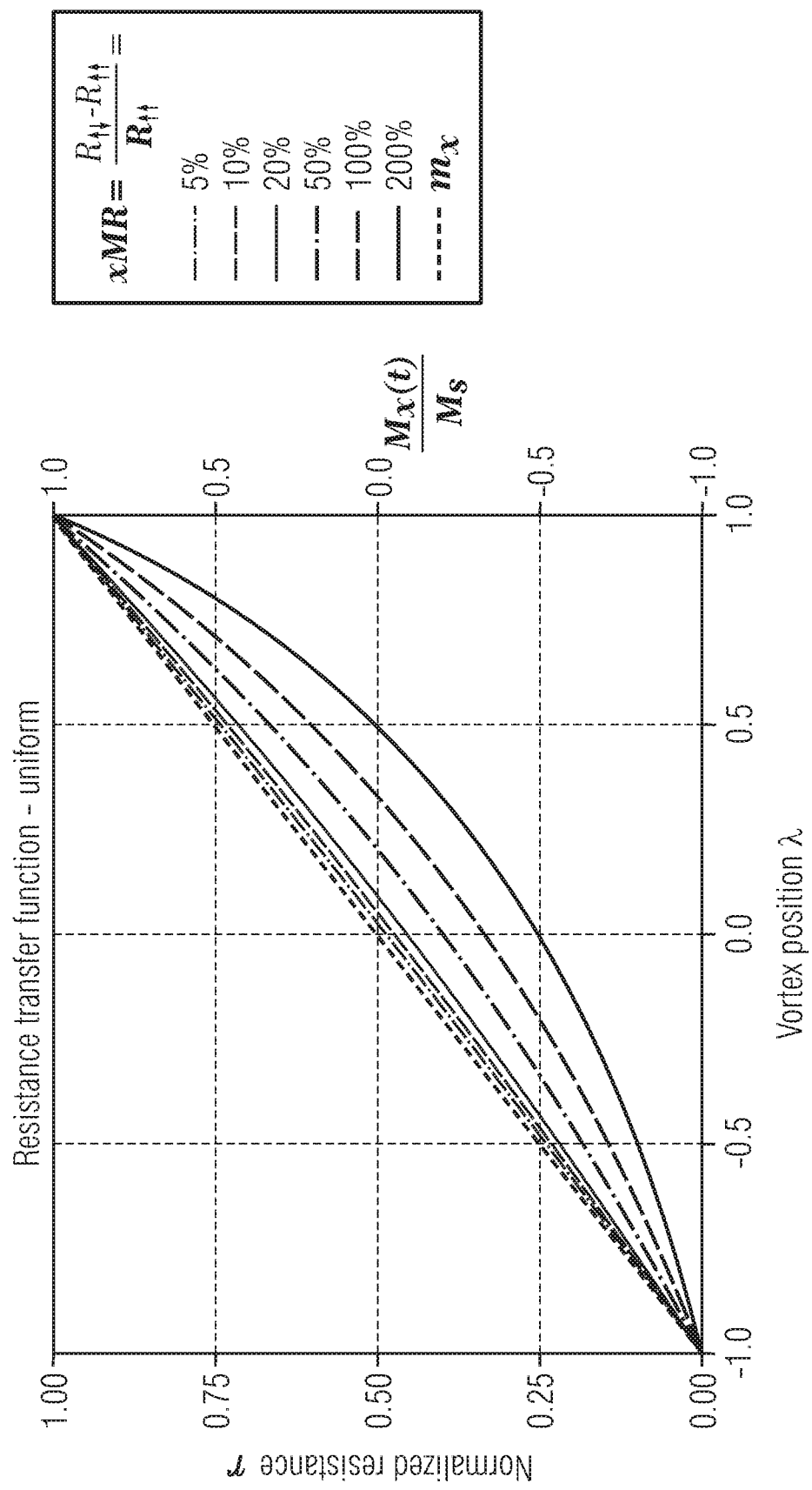
FIG. 2 shows a resistance transfer function of a magneto-resistive structure in a conventional magnetic sensor arrangement.

The resulting normalized resistance transfer function depicted in FIG. 2 shows the effects of the non-uniform current distribution when using a uniform parallel circuit model, where current flow is directed parallel to the pinned layer magnetization. The relative xMR increment (XMR) denotes the relative correlation of resistivities of regions with parallel alignment and anti-parallel alignment of magnetic fields. Resistance transfer functions are plotted in FIG. 2 for xMR increment values of 5%, 10%, 20%, 50%, 100%, and 200%. Normalized resistance r is displayed along the left-hand side y-axis. It may be seen that the higher this relative xMR increment, the higher the deviation from the desired symmetricity. At zero field, which corresponds to vortex position 0, the magnetization $m_x = M_x(t)/M_s$ displayed along the right-hand side y-axis is zero on average. The resistance however deviates from the middle value between maximum and minimum, due to the non-uniform current distribution.

In addition to the non-uniform current distribution caused by the vortex core, the current distribution may also be determined by the shape of the free-layer and the contacts, even for homogeneous magnetization states. To account for the non-uniform base current-distribution, the distribution parameters A and B may be adjusted to match the distribution which can be written in the form of $$j(\lambda) = a\lambda^2 + c,$$

leading to $$A(\lambda) = \int_{-1}^{\lambda} j(\lambda')d\lambda' \quad B(\lambda) = \int_{\lambda}^{+1} j(\lambda')d\lambda' \quad Z = \int_{-1}^{+1} j(\lambda')d\lambda'$$

Figure 3:
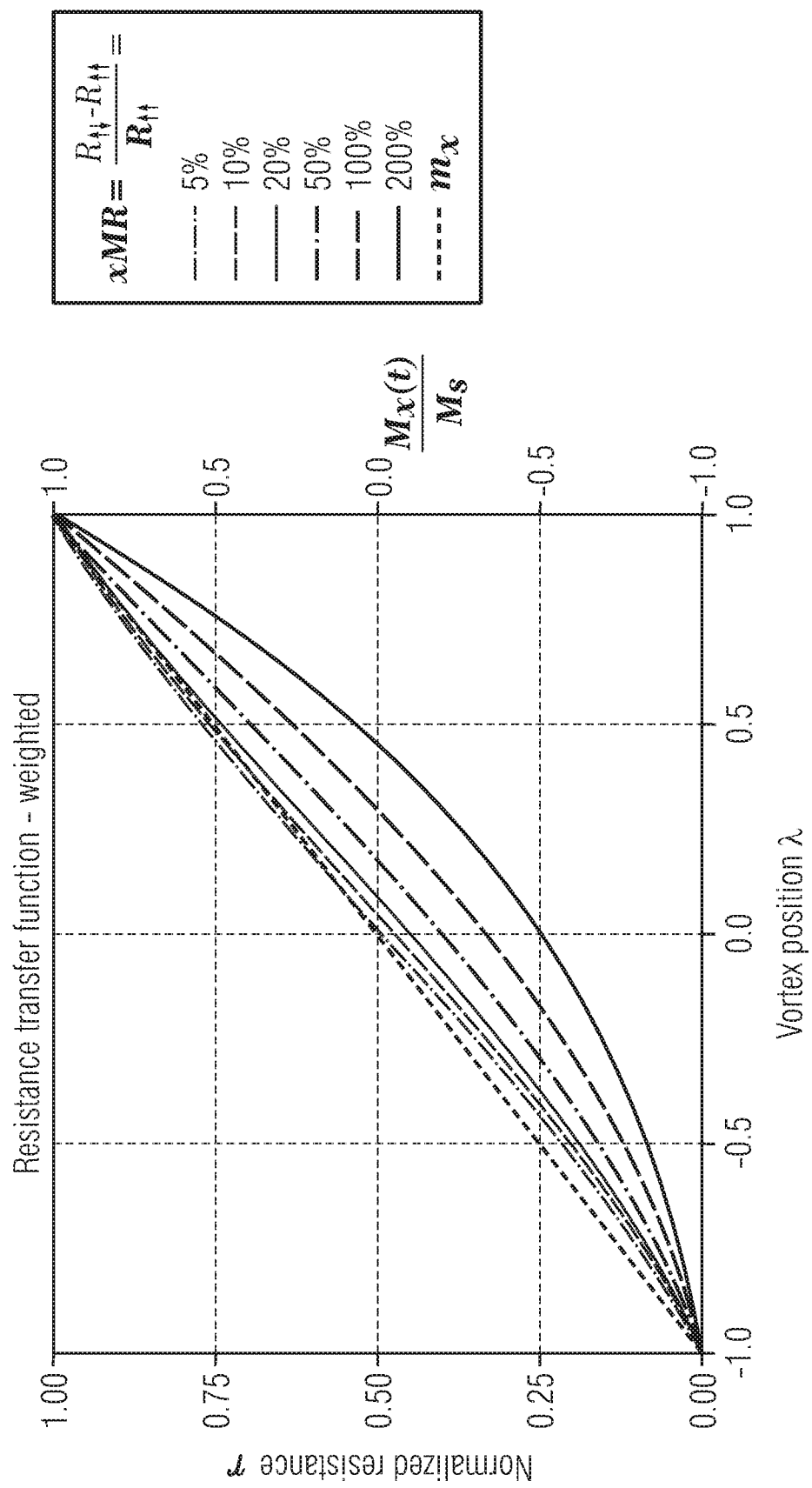
FIG. 3 shows a weighted resistance transfer function of an xMR sensor layer in a conventional magnetic sensor arrangement.

The resulting transfer function for the weighted parallel circuit model can be seen in FIG. 3. Like in FIG. 2, resistance transfer functions are plotted for xMR increment values of 5%, 10%, 20%, 50%, 100%, and 200%. Normalized resistance r is displayed along the left-hand side y-axis, and magnetization $m_x = M_x(t)/M_s$ is displayed along the right-hand side y-axis. It may be seen that the asymmetry in resistance for positive and negative shifts of $\lambda$ still remains, especially for large values of the xMR increment.

Figure 4:
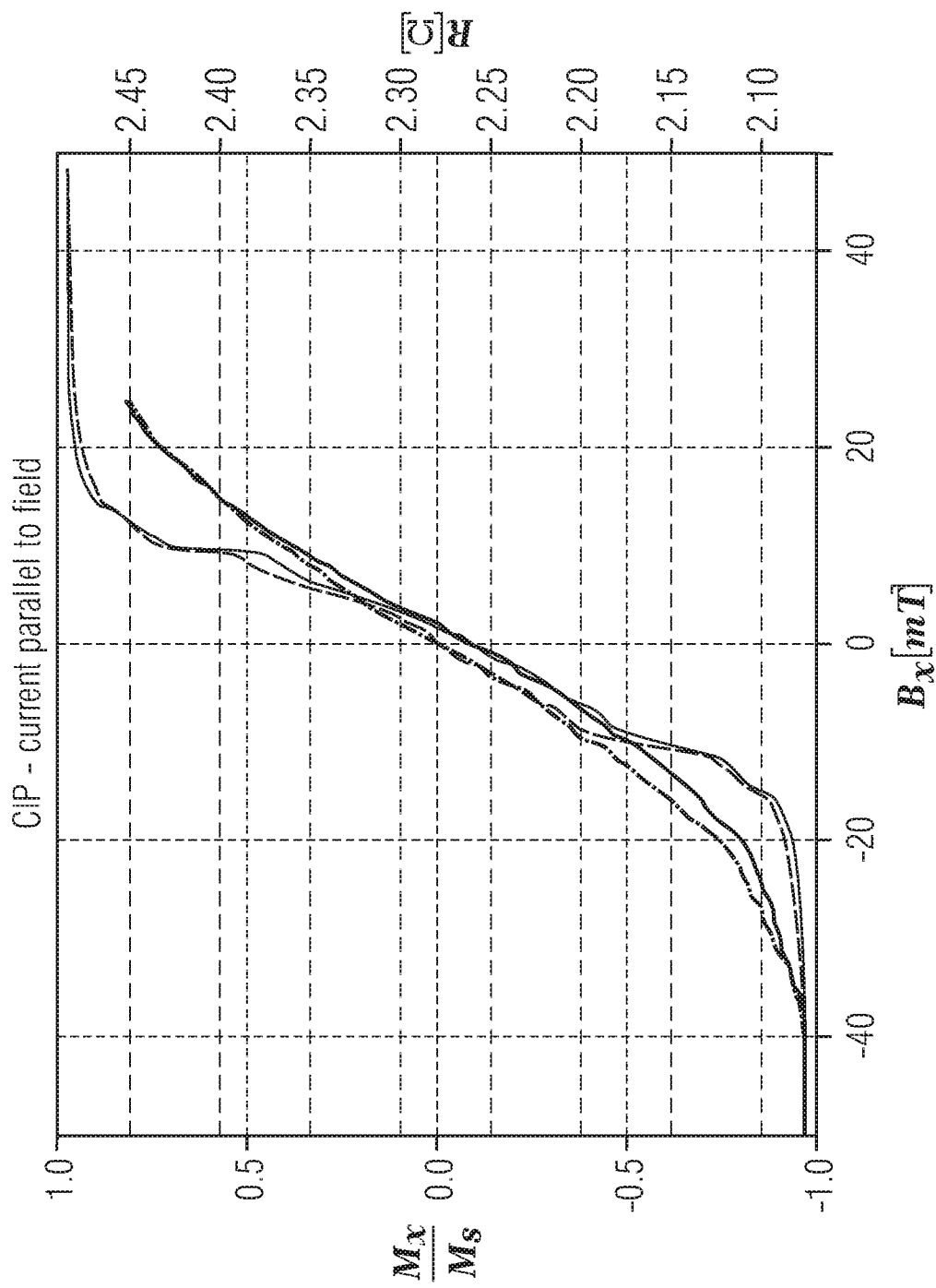
FIG. 4 shows a comparison of resistance and magnetization functions for an xMR sensor in a conventional magnetic sensor arrangement.

The deviating resistance transfer function may also be observed in finite element simulations capable of computing the magnetic state and self-consistently determining the resulting current distribution for a given relative GMR increment. Turning now to FIG. 4, to illustrate the effect, a very high relative GMR increment of 20% is assumed. FIG. 4 shows a comparison of magnetization and resistance for a CIP structure where the current flow is parallel to the sensitive field direction. Note that the thick lines represent a vortex state, while the thin lines represent a non-vortex state. The thin line starts from the non-vortex state and jumps for fields of about 10 mT into the vortex state and overlaps with the thick line (always in vortex state). The x-axis displays external magnetic field strength in sensing direction (parallel to the pinned layer magnetization) measured in mT. The transfer functions are normalized for their respective minimum/maximum. The simulation results of FIG. 4 and the model transfer function for a 20% GMR effect (compare FIG. 3) are in extremely good agreement, which suggests that the resistance transfer function of a CIP GMR structure may be determined by the current distribution in the free layer to a considerable extent.

Figure 5A:
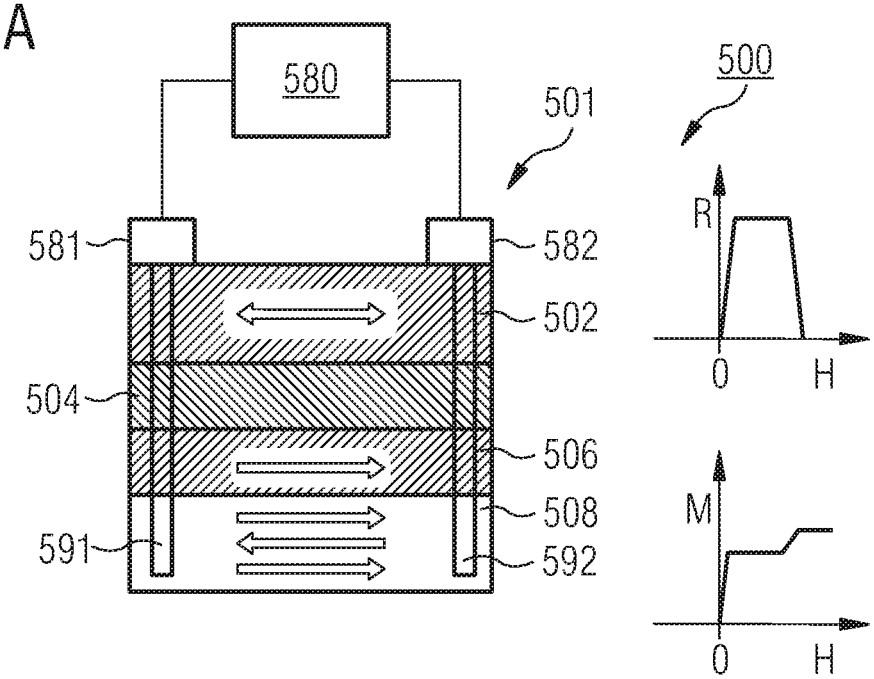
FIGS. 5A-5F show side views of magnetic sensor devices with magneto-resistive structures according to various embodiments.
Figure 5B:
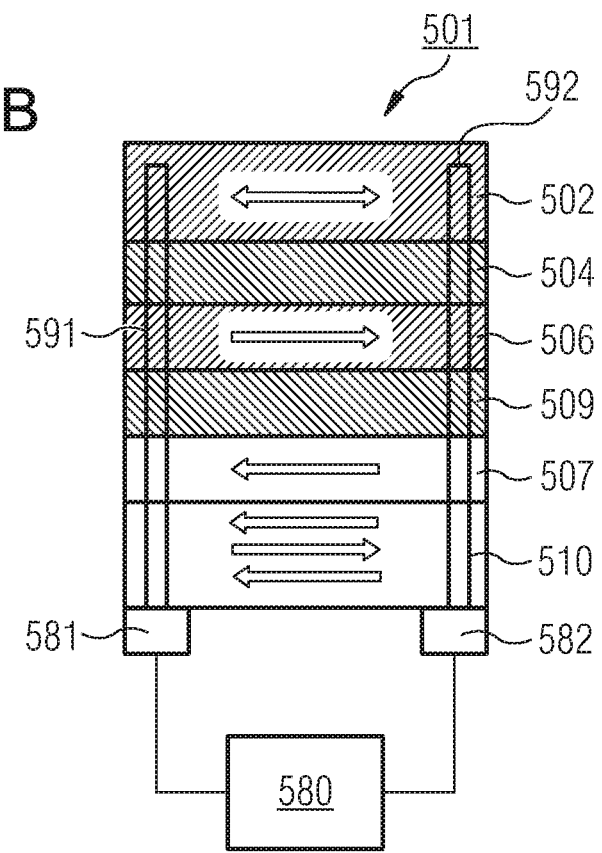
Figure 5C:
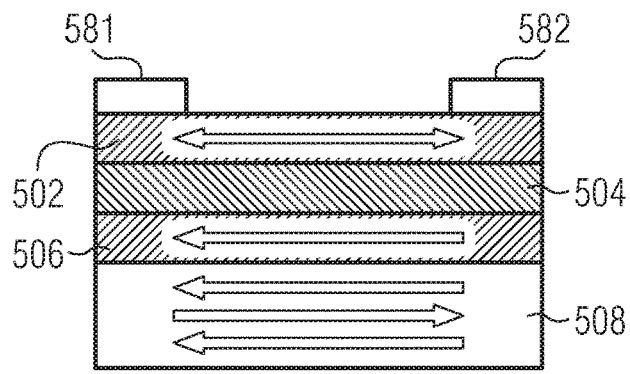
Figure 5D:
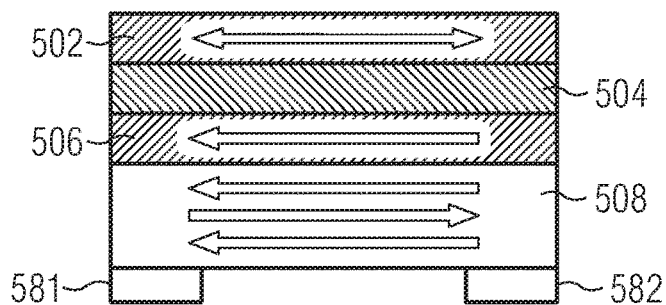
Figure 5E:
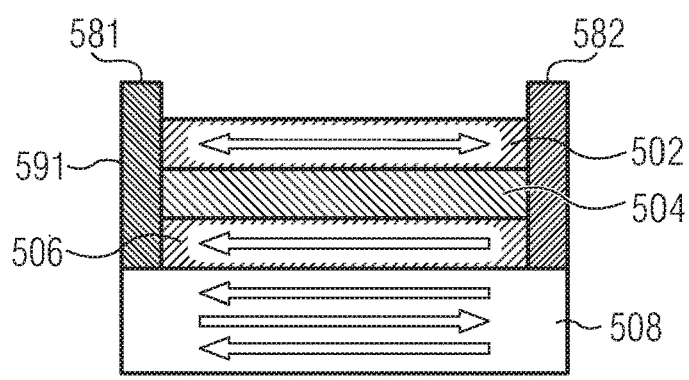

FIGS. 5A and 5B show side views of example embodiments of magnetic sensor devices 500 with different magneto-resistive structures 501.

In the following, it will be briefly gone into GMR structures as examples of magneto-resistive structures 501. GMR structures are almost always operated in a so-called CIP (current-in-plane) configuration, i.e. the applied current flows in parallel to the sheet structure. In the GMR structures, there are some basic types that have gained acceptance in practice. Some example GMR structures for the practical employment are illustrated in the embodiments of FIGS. 5A and 5B.

The GMR structure 501 illustrated in FIG. 5a shows a spin valve system, in which a non-magnetic layer 504 is chosen so thick that no coupling of soft-magnetic layers 502, 506 develops. The lower magnetic layer 506 is strongly coupled to an antiferromagnetic layer 508, so that it is magnetically hard (comparable with a permanent magnet). Magnetic layer 506 may be regarded as a reference layer. The upper magnetic layer 502 is soft magnetic and serves as free measuring layer. It may be re-magnetized by already a small external magnetic field M, whereby the resistance R changes.

In the following, it is now gone into the spin valve arrangement 501 illustrated in FIG. 5A in greater detail. Such a spin valve structure 501 comprises a soft-magnetic layer 502 (free layer), which is separated, by a non-magnetic layer 504, from a second soft-magnetic layer 506, the magnetization direction of which is, however, pinned by the coupling with an antiferromagnetic layer 508 by means of the so-called "exchange bias interaction". The principle functioning of a spin valve structure may be illustrated by means of the magnetization and R(H) curve in FIG. 5a. The magnetization direction of the magnetic layer 506 is pinned in negative direction. If the external magnetic field M is increased from negative to positive values, the "free", soft-magnetic layer 502 switches near the zero crossing (H=0), and the resistance R rises sharply. The resistance R then remains high until the external magnetic field M is great enough to overcome the exchange coupling between the soft-magnetic layer 506 and the antiferromagnetic layer 508 and to switch also the magnetic layer 506. In the example of FIG. 5a, the spin valve system 501 is contacted from top by means of contacts 581 and 582. Optionally, the contacts 581 and 582 may comprise corresponding contact vias 591, 592 vertically extending through one or more (for example all) layers of magneto-resistive structure 501. The vias 591, 592 may provide electrical connection to electrical contacts 581, 582 throughout one or more (for example all) layers of magneto-resistive structure 501. Alternatively, the contact pads 581 and 582 could also be located on the bottom.

The GMR structure 501 illustrated in FIG. 5b differs from the GMR structure illustrated in FIG. 5A in that here the lower antiferromagnetic layer 508 is replaced by a combination of a natural antiferromagnet 510 and a synthetic antiferromagnet 506, 507, 509 (SAF) on top, which is composed of the magnetic layer 506, a ferromagnetic layer 507, and a non-magnetic layer 509 between. In this manner, the magnetization direction of the magnetic reference layer 506 is pinned. The upper, soft magnetic layer 502 again serves as free measuring layer, the magnetization direction of which can be rotated easily by an external magnetic field M. The advantage of the use of the combination of natural and synthetic antiferromagnets as compared to the construction according to FIG. 5A is the greater field and temperature stability. In the example of FIG. 5B, the spin valve system 501 is contacted from bottom by means of contacts 581 and 582 including corresponding vias 591, 592 which may provide electrical connection to electrical contacts 581, 582 throughout one or more (for example all) layers of magneto-resistive structure 501. Alternatively the contacts 581, 582 could also be located on top.

Figure 5F:
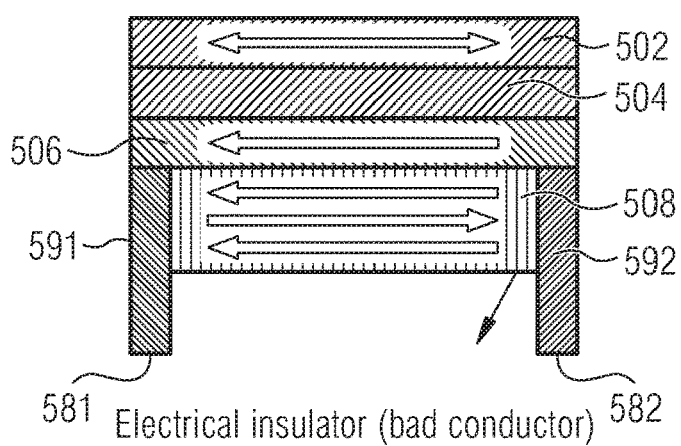

Further examples of magneto-resistive structures with respective electrical contacts 581, 582 and vias 591, 592 are illustrated in FIGS. 5C-5F It is to be understood that contact vias 591, 592 may be of interest in order to traverse a layer of rather low electrical conductivity, for example the antiferromagnetic layer 508 with a rather low electrical conductivity compared to the other layers (see, for example, FIG. 5F).

In the illustrated examples, magnetic sensor devices 501 are implemented as GMR sensor elements in CIP configuration. While in operation, or when coupled to an electric circuit, current flows along the layers (in plane). However, the skilled person having benefit from the present disclosure will appreciate that other embodiments may also be implemented as TMR, anisotropic (AMR), colossal (CMR), extraordinary (EMR), or any other xMR sensor element.

Magnetic free layer 502 is configured to spontaneously generate a closed flux magnetization pattern (not visible in the side views of FIG. 5A, 5B) in free layer 502. Reference layer 506 has a non-closed flux reference magnetization pattern. Magnetic sensor device 500 further comprises one or more current generation devices 580 configured to generate an electric current in one or more layers (such as magnetic free layer 502, for example) of the magneto-resistive structure 501. Thereby the electric current has a non-zero directional component perpendicular to reference magnetization pattern, or, in other words, a non-zero component in the y-z plane. The skilled person having benefit from the present disclosure will appreciate that current generation device 580 may include current and/or voltage sources.

Current generation device 580 may comprise a pair of electrical contacts or electrodes 581; 591 and 582, 592 or several pairs of contacts. To electrodes 581, 591 and 582, 592 different electric potentials may be applied, respectively, causing an electric voltage between these electrodes 581, 582. Current generation device 580 may further comprise any means configured to apply a voltage between two points of free layer 502. Therein, an imaginary line linking the two points may have a non-zero y-component.

In some embodiments, current generation device 580 may be configured to generate the electric current through the magneto-resistive structure 501 such that the current has a component perpendicular to the reference magnetization pattern which is at least two times larger than current parallel to the reference magnetization pattern.

In some embodiments, current generation device 580 may be configured to generate the electric current having a non-zero directional component in-plane, or, in other words, a non-zero component in the x-y plane. In some example embodiments, the current generation device 580 may be configured to generate the electric current in the magneto-resistive structure and thus also the magnetic free layer perpendicular to the reference magnetization pattern. In other words, also a z-component of the electric current may be zero.

In some embodiments, current generation device 580 comprises at least a first electrode 581 coupled to the magneto-resistive structure 501 (for example to free layer 502) and a second electrode 582 coupled to the magneto-resistive structure 501 (for example to free layer 502) to cause an electrical current in the magneto-resistive structure 501 502 between first and second electrodes 581, 582 in a direction having a component perpendicular to reference magnetization pattern, or, in other words, having a non-zero y-component. In the examples of FIGS. 5A-5F, the current generation device 580 comprises one first electrode 581 and one second electrode 582, each of which may be formed by a single contiguous electrical contact portion. Note that the first electrode 581 and the second electrode 582 may both either be placed on top of the magneto-resistive structure 501 or at the bottom, as shown in FIG. 5A and FIG. 5B.

Spin valve sensors comprising magneto-resistive structure may be implemented as a simple pinned structure comprising one (e.g. pinned layer) or more ferromagnetic layers (e.g. pinned layer and reference layer) with a unidirectional magnetic moment. In an antiparallel (AP) pinned layer structure, the magnetizations of pinned layer and reference layer may substantially counterbalance one another. Thus, the net magnetization of the AP pinned layer structure may less affect the quiescent parallel position of free layer 502. Some embodiments may refer to a magneto-resistive structure having only one ferromagnetic layer apart from free layer 502, or, in other words, omitting reference layer. Reference magnetization pattern may therein correspond to a pinned layer magnetization pattern. Magnetization therein may however be more unstable against external fields.

Spin valve sensors comprising magneto-resistive structure may still further be classified as single or dual. A single spin valve sensor may employ only one pinned layer and a dual spin valve sensor may employ two pinned layers, for example with the free layer structure located in between. Magneto-resistive structure may, in some further embodiments, represent a hard magnetic, or also a multilayer reference system with three or more ferromagnetic layers separated by spacer layers, coupled parallel or antiparallel.

Though free layer 502 in FIGS. 5A-5F may have a disk shape, other centrally symmetric or rotationally symmetric shapes may be realized in different embodiments. Such shapes may for example comprise ellipses, triangles, quadrangles (squares, rhombuses, etc.), regular or axisymmetric hexagons, or other polygons just to mention a few possibilities. Moreover, any other shape which does not have such symmetry, for example an irregular polygon or a disk which is cut at one side, may even be used.

FIGS. 6A, 6B, and 6C show different contour plots of magnetization and current densities, respectively, in a free layer. An arrow indicates the direction of reference magnetization in all three figures, respectively, which is arranged such that the sensor has an x-sensitive field direction. As is shown in FIG. 6A, for example an upper section 610 of the free layer has a magnetization predominantly parallel, and a lower section 620 of the free layer has a magnetization predominantly anti-parallel to the reference magnetization. FIG. 6B shows a conventional implementation with a free layer 600 having a magnetization corresponding to FIG. 6A, where two electrical contacts 630, 640 are used to generate an electric current parallel to a reference magnetic field or reference magnetization. It may be seen here that if the current flow is parallel to the sensitive field direction, the current distribution is asymmetric since the current is able to avoid high-resistivity regions of the structure. In other words, current density is higher in the upper section 610 of free layer 600 than in the lower section 620. FIG. 6C shows an embodiment of a free layer, corresponding for example to free layer 502 of FIG. 5 and having a magnetization corresponding to FIG. 6A. First electrode 581 and second electrode 582 may allow a flow of current perpendicular to the reference magnetization. For current flow perpendicular to the field direction, the current-distribution may be much more uniform.

In other words, electrodes 581 and 582 may be placed such that the direction of current flow is perpendicular to the magnetization of the reference layer, or in some embodiments, perpendicular to the magnetization of the pinned layer, which may define a sensitive field direction. In some embodiments, electrodes 581 and 582 are preferably located on opposite sides of free layer 502. The term "opposite" may therein be related to an axis in x-direction crossing a central point of free layer 502, which may correspond e.g. to a geometric center or barycenter of free layer 502. While this may under some circumstances constrain sensor range, there may no longer be one set of current paths with high electrical resistance and one set of current paths with low resistance, but rather paths of similar electrical resistance all across the magneto-resistive structure 501 and thus free layer 502, which may lead to a more uniform current distribution and a more symmetrical resistance transfer function.

In some embodiments, a vector between the center point of the first electrode 581 and the center point of the second electrode 581 may have a component in the direction perpendicular to the reference magnetization which is larger than 25% of a diameter of the free layer 600.

Figure 7:
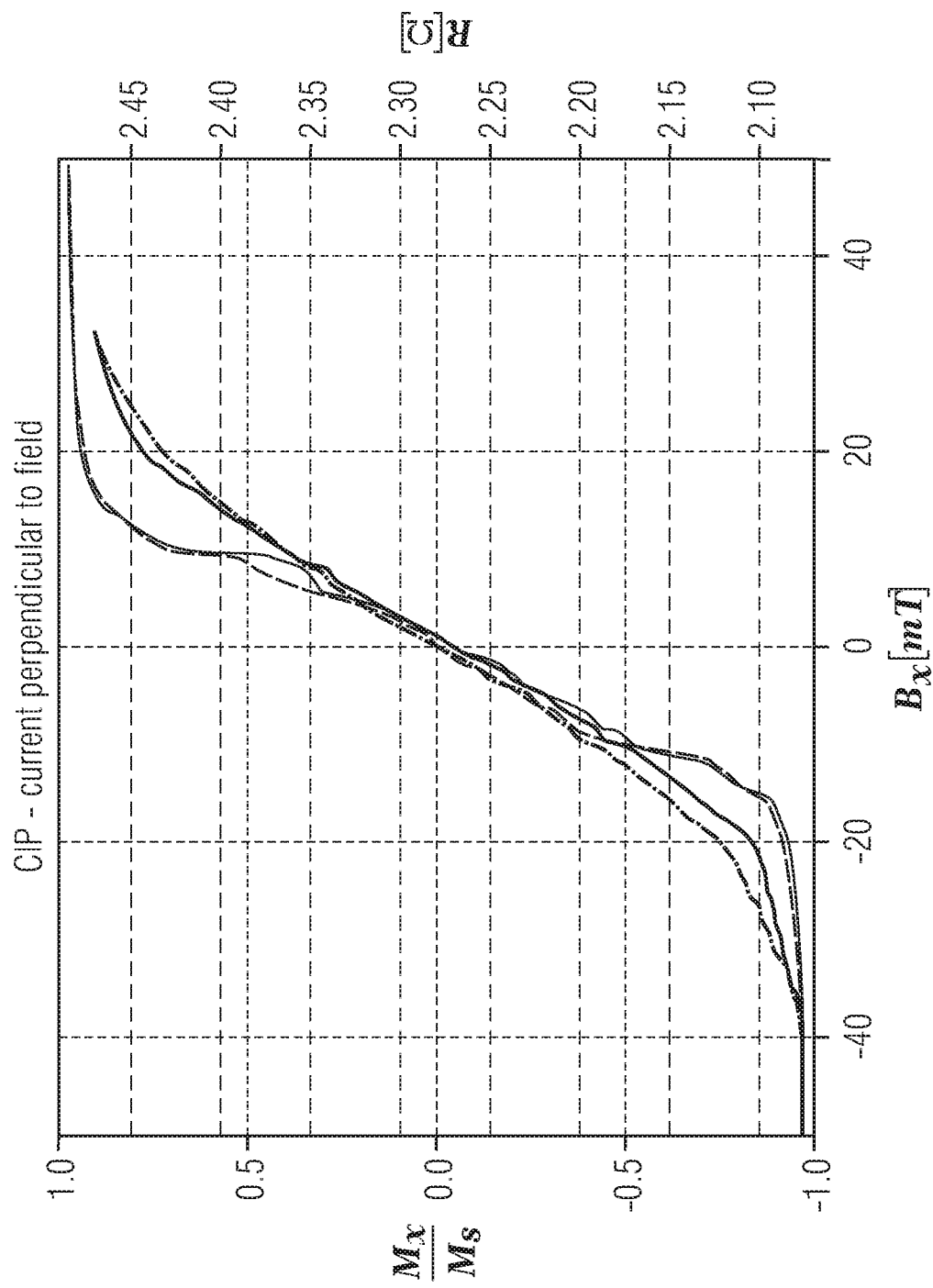
FIG. 7 shows a comparison of resistance and magnetization functions for a magnetic sensor device in a circuit arrangement according to an embodiment.

FIG. 7 shows simulated resistance transfer and magnetic transfer functions for the current-perpendicular-to-field structure according to an embodiment. While the resistance transfer function still deviates from the magnetization transfer function, it is much more similar and thus much more linear. The remaining non-linearity may originate in the immediate vicinity of the vortex core. It may thus be desirable to have contact vias 591, 592 or electrodes 581, 582 with maximum lateral size. In some embodiments, first electrode 581, 591 and/or second electrode 582, 592 therefore span at least 50% of a diameter of free layer 502 in a direction parallel to the reference magnetization pattern.

Figure 8:
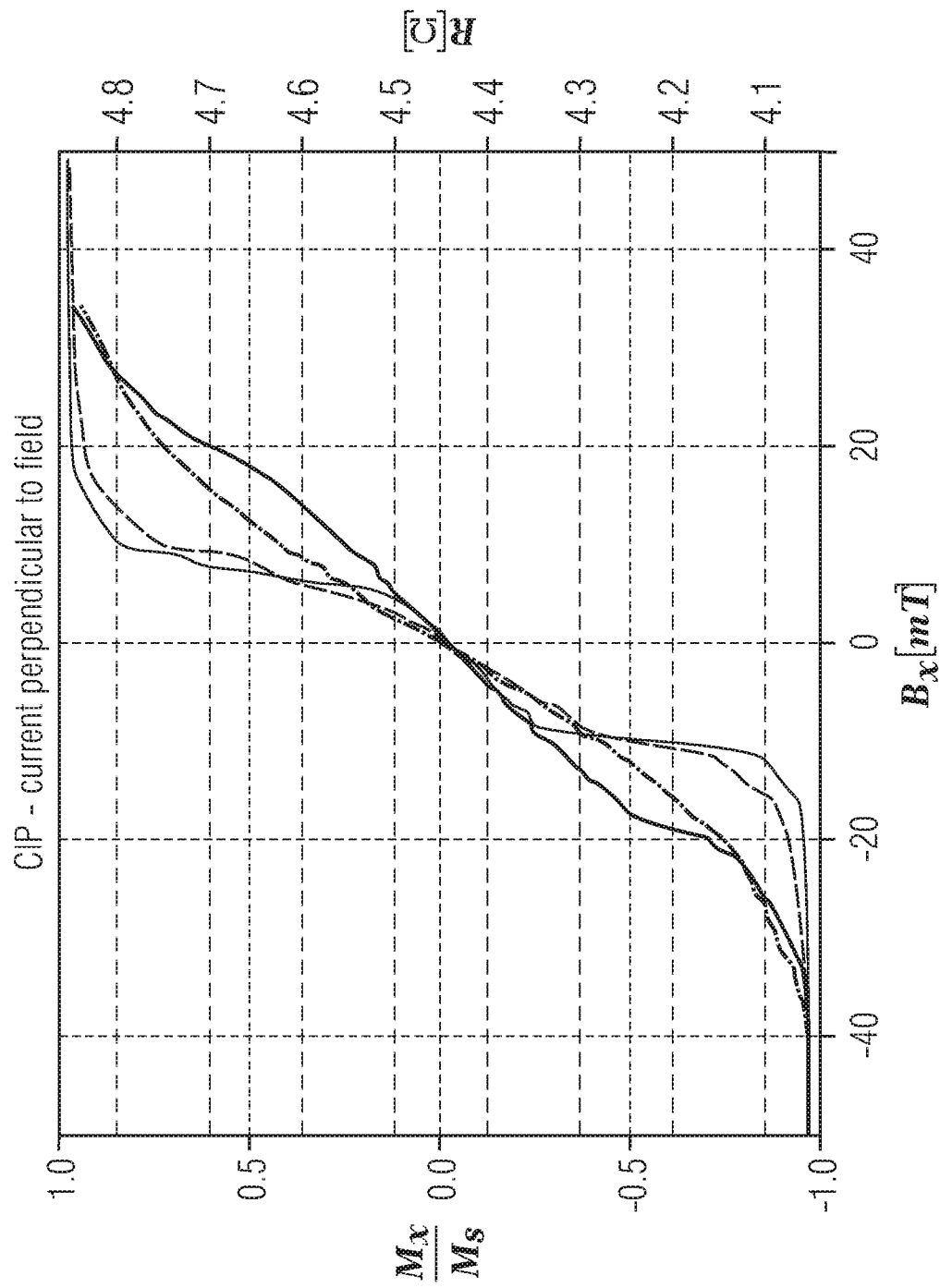
FIG. 8 shows a comparison of resistance and magnetization functions for a magnetic sensor device in a circuit arrangement according to another embodiment.

If the electrodes 581, 582 and/or the contact vias 591, 592 are narrow and the vortex core is near one of the electrodes 581, 582 and/or the vias 591, 592, the total resistance may become distorted, as may be seen from FIG. 8. This is because the current may then be forced to traverse the vortex core, which might not be representative of the overall magnetization state. The underlying structure for the simulations results shown in FIG. 8 corresponds to that for FIG. 7, however, the electrodes 581, 582 in FIG. 8 are notably smaller. In other words, electrodes 581, 582 in FIG. 8 extend less far in reference magnetization direction. If the electrodes 581, 582 are wider, the current may have more alternative paths to avoid the vortex core region.

Figures 9A, 9B, 9C:
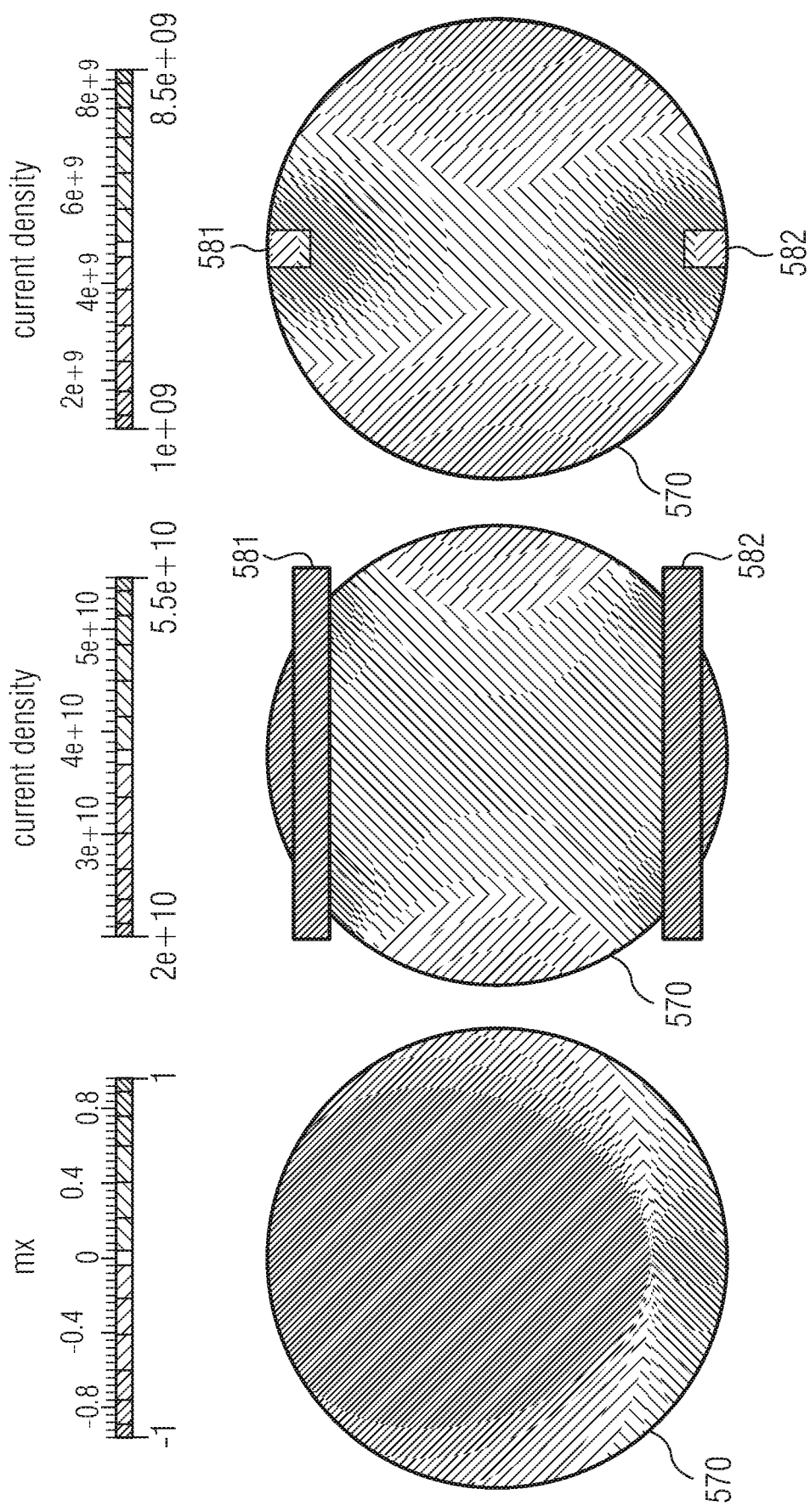
FIG. 9A shows a contour plot of a closed-flux magnetization pattern in a free layer according to another example.
FIG. 9B shows current distribution in the free layer of FIG. 8a if the current is applied perpendicular to a reference magnetization pattern using electrical contacts according to a first embodiment.
FIG. 9C shows current distribution in the free layer of FIG. 8a if the current is applied perpendicular to a reference magnetization pattern using electrical contacts according to a second embodiment.

FIGS. 9A, 9B, and 9C illustrate how current paths may change for different widths of electrodes 581, 582 which may comprise contact vias 591, 592. FIG. 9A shows free layer 502 with a vortex state of magnetization. The vortex center is shifted towards a lower edge of free layer 502 by more than half a radius of free layer 502 due to the strength of the external magnetic field, bringing the vortex center close to second electrode 582. FIG. 9B shows an arrangement according to one embodiment, where electrodes 581, 582 span more than 50% of the diameter of free layer 502, and FIG. 9C shows another arrangement according to an embodiment, where electrodes 581, 582 span just about 10% of the diameter of free layer 502. Since the current may be much more focused to the center of free layer 502 in case of the small electrodes 581, 582 shown in FIG. 9C, the approaching vortex core may have a much greater influence on the current distribution than in the embodiment shown in FIG. 9B.

It may further be desirable to place the electrodes 581, 582 and/or the vias 591, 592 as far away from each other as possible to limit the loss in field range (which may also be observed in FIG. 7, and may result in higher slope for the resistance and less GMR range), as the vortex core may travel 'under' the electrodes 581, 582. Hence, in some example embodiments, a distance between first electrode 581 and second electrode 582 is at least 50% of a diameter of free layer 502 in a direction perpendicular to the reference magnetization pattern.

Figure 10:
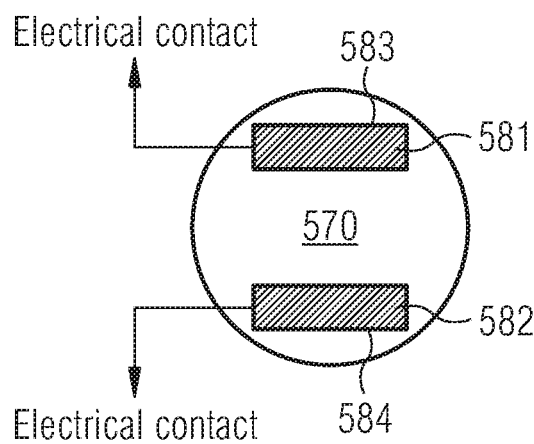
FIG. 10 shows a choice of free layers with various geometries for electrical contacts according to some embodiments.
Figure 10:
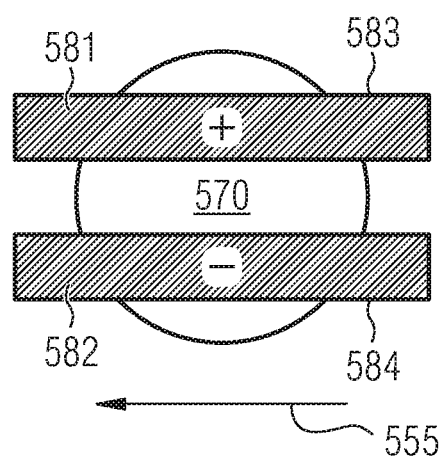
Figure 10:
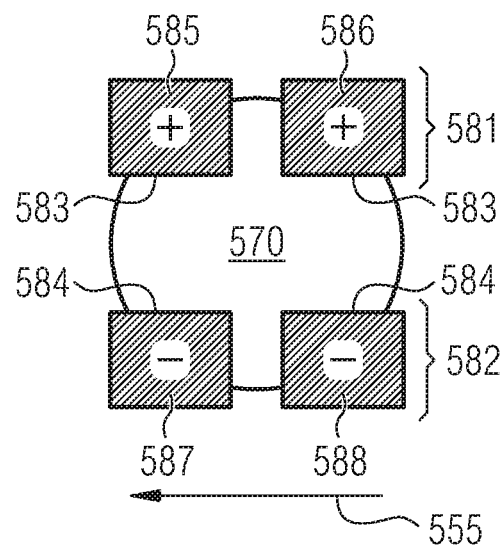
Figure 10:
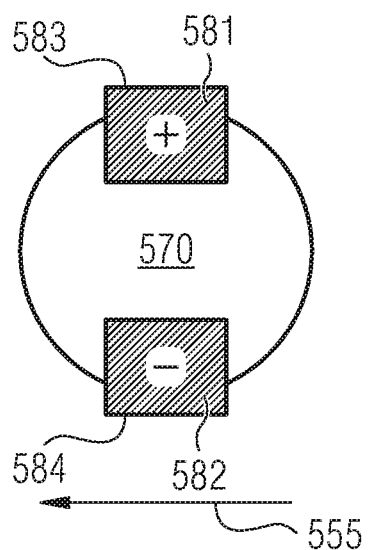
Figure 10:
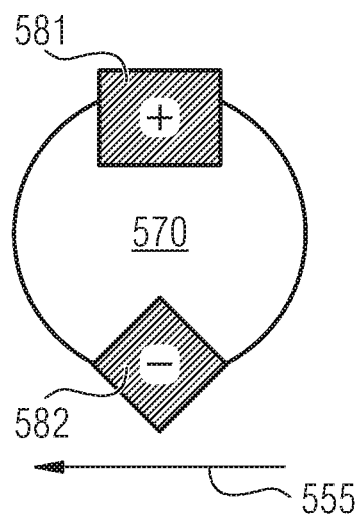

Turning now to FIG. 10, several example embodiments for the electrodes 581 and 582 are presented. In some embodiments, at least one of the first and the second electrodes 581 and 582 has a rectangular shape with a main extension along the reference magnetization pattern 555. In a preferred embodiment depicted in the upper panel, the first and second electrodes 581; 582 both have a rectangular shape, with long edges 583 and 584 of both being aligned parallel to each other. Electrodes 581 and 582 each provide an electrical contact to couple free layer 502 (or the magnetic sensor device comprising free layer 502) to an electric circuit. Hence, first electrode 581 may form a positive, and second electrode 582 may form a negative electrical pole, as is shown in the middle and lower panels of FIG. 10, or vice versa. Furthermore, at least one of first and second electrodes 581; 582 may have an edge 583; 584 extending parallel to reference magnetization 555 and face an opposite of first and second electrodes 581; 582.

As explained in a previous embodiment, a length of electrodes 581; 582 parallel to reference magnetization 555 may be at least 50% of the diameter of free layer 502, as is the case in the upper panel. In the middle left panel, the respective lengths of electrodes 581 and 582 are even more than 90% of free layer 502. The length of an electrode may also be regarded as a line on which free layer 502 and edge 583; 584 are in contact to each other. In other embodiments, as shown in the lower left panel, electrode length may also be less than 50%. For a circular, disk-shaped free layer 502, a smaller length on the one hand may allow electrodes to be placed closer to the upper and lower edges, respectively, of free layer 502, and thus increase sensor range. A larger length of electrodes 581; 582 on the other hand may lead to a more wide-spread current distribution in free layer 502, and thus reduce perturbations in the resistance transfer function (also compare FIGS. 7 and 8) arising from current paths close to the vortex core. In another embodiment (not shown here) related to a circular free layer, electrodes may each have a length of 1/sqrt(2)≈0.71 times the disk diameter, and be placed apart from each other by 1/sqrt(2)≈0.71 times the disk diameter, within production tolerances of e.g. up to 5%. Such an embodiment may possibly improve a compromise of more homogeneous current distribution and higher sensor range.

In some embodiments, first electrode 581 and/or second electrode 582 comprise at least a first electrode region and a separate second electrode region. As depicted in the middle right panel, first electrode 581 comprises a first electrode region 585 and a separate second electrode region 586, and likewise second electrode 582 comprises a first electrode region 587 and a separate second electrode region 588. A contact region between free layer 502 and first electrode region 585; 587 is spatially separated from a contact region between free layer 502 and second electrode region 586; 588. This may offer a possibility for the current to avoid direct crossing of a vortex center, which may otherwise lead to perturbation effects. The electrodes 581; 582 may also, in other embodiments, be split up into three or four separate electrode regions. Depending on an exact location of the vortex core (and thus possibly on a shape of free layer 502, which may be different from circular), this may lead to a more homogeneous current distribution. First electrode region 585; 587 and second electrode region 586; 588 in the middle right panel of FIG. 10 are of equal length in a direction parallel to reference magnetization 555, but may also differ from each other.

A geometrical shape of electrodes 581 and/or 582 may further differ from a rectangular shape, as is shown in the lower right panel. The shapes of electrodes 581 and 582 may even be different from each other. For example, first electrode 581 may be circular, and second electrode 582 may have a diamond shape. In yet another embodiment, first and second electrodes 581; 582 may have a concave edge facing the respective other electrode 581; 582. The concave edges may follow a circular line parallel to a perimeter or edge of circular free layer 502. In other words, a central point of the circular line may coincide with a central point of circular free layer 502. This may allow a positioning of electrodes 581; 582 closer to the edge which may improve sensor range.

Explained again in other words, some embodiments may relate to a current-in-plane device comprising a magnetic free layer in a vortex state and a uniaxial reference layer magnetization, which is electrically contacted in a way that allows the current to flow perpendicular to the reference layer direction. Some embodiments relate to a magneto-resistive sensor element. The magneto-resistive sensor element comprises a magnetic free layer configured to spontaneously generate a vortex magnetization pattern in the free layer. The magneto-resistive sensor element also comprises a magnetic reference layer having a straight reference magnetization pattern. The magneto-resistive sensor element further comprises a first electrical contact portion mounted to the free layer and spanning at least 50% of a diameter of the free layer in a direction parallel to the reference magnetization pattern. Furthermore, the magneto-resistive sensor element comprises a second electrical contact portion mounted to the free layer opposite to the first electrical contact portion and spanning at least 50% of a diameter of the free layer in a direction parallel to the reference magnetization pattern. The first and the second electrical contact portions are configured to generate an electric field between the first and the second electrical contact portions perpendicular to the reference magnetization pattern in the magnetic free layer. This proposal to contact the device may lead to more homogenous current distribution in the device and, in consequence, to improved linearity.

Figure 11:
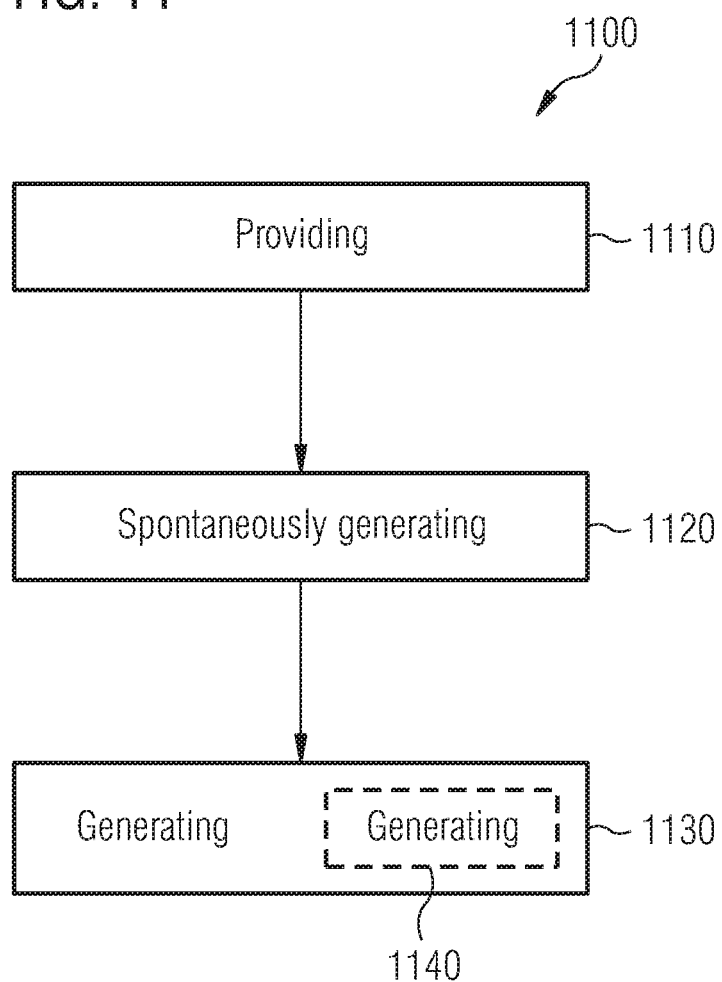
FIG. 11 shows a flow chart of a method for a magnetic sensor device according to an embodiment.

FIG. 11 shows a method 1100, according to an embodiment, for a magnetic sensor device having a magneto-resistive structure. Method 1100 comprises providing 1110 a non-closed flux reference magnetization pattern in a magnetic reference layer of the magneto-resistive structure. Method 1100 also comprises spontaneously generating 1120 a closed flux magnetization pattern in the magnetic free layer. Method 1100 further comprises generating 1130 an electric current in the magneto-resistive structure. The electric current has a non-zero directional component perpendicular to the reference magnetization pattern. Differences in overall resistivity of different possible current paths may thus be lessened. Since electric current may naturally follow a path of least resistance, a given path may thus become less preferable over another. This may enforce a more even distribution of current over possible current paths. In consequence, vortex shifts in a direction perpendicular to the reference magnetization may result in a less asymmetric resistance transfer function. More asymmetric resistance transfer functions may lead to differences in sensitivity of the magnetic sensor device to external magnetic field changes in positive direction compared to changes in negative direction, which may be reduced by employing method 1100.

In some embodiments, the contact position are designed in a way that the generated current has a spatially averaged component perpendicular to the reference system which is larger at least by a factor of two compared to the spatially averaged component parallel to the reference system.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A magnetic sensor device, comprising:
   a magneto-resistive structure comprising:
   a magnetic free layer configured to spontaneously generate a closed flux magnetization pattern in the magnetic free layer,
   a magnetic reference layer having a non-closed flux reference magnetization pattern, and
   a plurality of electrical contacts including corresponding vias extending through a plurality of layers of the magneto-resistive structure; and
   a current generator configured to:
   generate an electric current in the plurality of layers of the magneto-resistive structure,
   the electric current having a non-zero directional component perpendicular to the non-closed flux reference magnetization pattern.

2. The magnetic sensor device of claim 1, wherein the current generator is configured to generate the electric current having a non-zero directional component in-plane.

3. The magnetic sensor device of claim 1, wherein the current generator is configured to generate the electric current perpendicular to the non-closed flux reference magnetization pattern.

4. The magnetic sensor device of claim 1, wherein the magnetic free layer is of centrally symmetric shape.

5. The magnetic sensor device of claim 1, wherein the current generator comprises at least a first electrode and a second electrode coupled to the plurality of electrical contacts to cause an electrical current in the magneto-resistive structure between the first electrode and the second electrode in a direction having a component perpendicular to the non-closed flux reference magnetization pattern.

6. The magnetic sensor device of claim 5, wherein the first electrode and the second electrode are located on opposite sides of the magnetic free layer.

7. The magnetic sensor device of claim 5, wherein at least one of the first electrode or the second electrode spans at least 50% of a diameter of the magnetic free layer in a direction parallel to the non-closed flux reference magnetization pattern.

8. The magnetic sensor device of claim 5, wherein a distance between the first electrode and the second electrode is at least 50% of a diameter of the magnetic free layer in a direction perpendicular to the non-closed flux reference magnetization pattern.

9. The magnetic sensor device of claim 5, wherein the first electrode and/or the second electrode comprise at least a first electrode region and a separate second electrode region,
   wherein a contact region between the magnetic free layer and the first electrode region is spatially separated from a contact region between the magnetic free layer and the second electrode region.

10. The magnetic sensor device of claim 5, wherein at least one of the first electrode or the second electrode has an edge extending parallel to the non-closed flux reference magnetization pattern and facing an opposite one of the first electrode or the second electrode.

11. The magnetic sensor device of claim 5, wherein at least one of the first electrode or the second electrode has a rectangular shape with a main extension along the non-closed flux reference magnetization pattern.

12. The magnetic sensor device of claim 1, wherein the magneto-resistive structure corresponds to a giant magneto-resistive (GMR) structure or a tunnel magneto-resistive (TMR) structure.

13. The magnetic sensor device of claim 1, wherein the magneto-resistive structure corresponds to a Current-In-Plane (CIP) structure.

14. A magneto-resistive sensor element, comprising:
   a magnetic free layer configured to spontaneously generate a vortex magnetization pattern in the magnetic free layer;
   a magnetic reference layer having a straight reference magnetization pattern;
   a first electrical contact portion comprising a first via extending through a plurality of layers of the magneto-resistive sensor element,
   the first electrical contact portion spanning at least 50% of a diameter of the magnetic free layer in a direction parallel to the straight reference magnetization pattern; and
   a second electrical contact portion comprising a second via extending through the plurality of layers,
   the second electrical contact portion being opposite to the first electrical contact portion and spanning at least 50% of a diameter of the magnetic free layer in a direction parallel to the straight reference magnetization pattern, and the first electrical contact portion and the second electrical contact portion being configured to generate, in the plurality of layers, an electric field between the first electrical contact portion and the second electrical contact portion perpendicular to the straight reference magnetization pattern.

15. The magneto-resistive sensor element of claim 14, wherein the magnetic free layer is of rotationally symmetric shape.

16. The magneto-resistive sensor element of claim 14, wherein the magnetic free layer is a circular disk shape.

17. The magneto-resistive sensor element of claim 14, wherein the magnetic free layer is an irregular polygon shape.

18. The magneto-resistive sensor element of claim 14, wherein the magnetic free layer is a circular disk shape having a cut at one side.

19. A method for a magnetic sensor device having a magneto-resistive structure, the method comprising:

providing a non-closed flux reference magnetization pattern in a magnetic reference layer of the magneto-resistive structure;

spontaneously generating a closed flux magnetization pattern in a magnetic free layer of the magneto-resistive structure; and generating an electric current flow in a plurality of layers of the magneto-resistive structure using a plurality of electrical contacts, the plurality of electrical contacts including corresponding vias extending through the plurality of layers, and the electric current flow having a non-zero directional component perpendicular to the non-closed reference magnetization pattern.

20. The method of claim 19, wherein generating the electric current flow comprises:

generating the electric current flow parallel to a plane of the plurality of layers.

* * * * *